(12) United States Patent
Chen et al.

(10) Patent No.: US 12,265,201 B2
(45) Date of Patent: Apr. 1, 2025

(54) LIGHT-EMITTING DEVICE ARRAY AND OPTICAL TRANSCEIVER SYSTEM HAVING THE SAME

(71) Applicant: HON HAI PRECISION INDUSTRY CO., LTD., New Taipei (TW)

(72) Inventors: Jun-Da Chen, New Taipei (TW); Yu-Heng Hong, New Taipei (TW); Wen-Cheng Hsu, New Taipei (TW); Tzu-Hsiang Lan, New Taipei (TW); Hao-Chung Kuo, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 18/463,273

(22) Filed: Sep. 7, 2023

(65) Prior Publication Data

US 2024/0411051 A1    Dec. 12, 2024

(30) Foreign Application Priority Data

Jun. 9, 2023   (TW) ................................ 112121695

(51) Int. Cl.
*G02B 1/00*   (2006.01)
*H01S 5/00*   (2006.01)

(52) U.S. Cl.
CPC .............. *G02B 1/002* (2013.01); *H01S 5/005* (2013.01)

(58) Field of Classification Search
CPC ................................ G02B 1/002; H01S 5/005
See application file for complete search history.

(56) References Cited

U.S. PATENT DOCUMENTS

2008/0122607 A1*   5/2008   Bradley ............. H04B 10/1125
                                                              340/475
2019/0121004 A1*   4/2019   Ahmed .................. G02B 5/021
(Continued)

FOREIGN PATENT DOCUMENTS

TW       202020547 A    6/2020
TW       202301765 A    1/2023
WO    2022173366 A1    8/2022

OTHER PUBLICATIONS

Aleš Vysocký et al., "Analysis of Precision and Stability of Hand Tracking with Leap Motion Sensor", Sensors 2020, 20, 4088; doi:10.3390/s20154088.
(Continued)

*Primary Examiner* — Georgia Y Epps
*Assistant Examiner* — Don J Williams
(74) *Attorney, Agent, or Firm* — CKC & Partners Co., LLC

(57) ABSTRACT

A light-emitting device array includes a first light-emitting device, a second light-emitting device, and a third light-emitting device. A first beam shaping structure of the first light-emitting device is configured to convert light emitted by a first light-emitting structure of first light-emitting device into first structured light. A second beam shaping structure of the second light-emitting device is configured to convert light emitted by a second light-emitting structure of second light-emitting device into second structured light. Speckle patterns and spatial distributions of the first structured light and the second structured light on a projection plane are the same. A third beam shaping structure of the third light-emitting device is configured to convert light emitted by a third light-emitting structure of third light-emitting device into third structured light.

17 Claims, 8 Drawing Sheets

(56) References Cited

U.S. PATENT DOCUMENTS

| | | |
|---|---|---|
| 2021/0263329 A1 | 8/2021 | Latawiec |
| 2021/0306564 A1 | 9/2021 | Hu et al. |
| 2022/0344545 A1 | 10/2022 | Tamma |
| 2023/0163262 A1* | 5/2023 | Antoniadis ......... H01L 25/0753 257/89 |

OTHER PUBLICATIONS

Youwen Huang et al., "Monolithic Microlens VCSELs With High Beam Quality," IEEE Photonics Journal, vol. 9, No. 4, Aug. 2017, Art No. 1504408, DOI: 10.1109/JPHOT.2017.2719702.

Xiangwei Zhang et al. "A beam-shaped study of the stable polarization VCSEL", Applied Physics B (2019) 125:97.

Hiroshi Nakajima et al., "Single transverse mode operation of GaN-based vertical-cavity surface-emitting laser with monolithically incorporated curved mirror", Applied Physics Express 12, 084003 (2019).

Guanzhong Pan et al., "Two-dimensional coherent VCSEL arrays with configurable beam emissions", Optics & Laser Technology 149 (2022) 107809.

Eric Hegblom et al., "col. addressable and matrix-addressable multi-junction VCSEL arrays for all electronic-scanning LiDAR", Proc. SPIE 12020, Vertical-Cavity Surface-Emitting Lasers XXVI, 1202007 (Mar. 2, 2022); doi: 10.1117/12.2611844.

Yi-Yang Xie et al.," Metasurface-integrated vertical cavity surface-emitting lasers for programmable directional lasing emissions", Nature Nanotechnology, vol. 15, Feb. 2020, pp. 125-130.

Qiu-Hua Wang et al., "On-Chip Generation of Structured Light Based on Metasurface Optoelectronic Integration", Laser and Photonics Reviews, 2021, 15, 2000385, DOI: 10.1002/lpor.202000385.

Zhanghao Sun et al., "Structured Light with Redundancy Codes", arXiv:2206.09243v1, 2022.

Zhenzhou Wang, "Robust three-dimensional face reconstruction by one-shot structured light line pattern." Optics and Lasers in Engineering 124 (2020) 105798.

* cited by examiner

LIGHT-EMITTING DEVICE ARRAY AND OPTICAL TRANSCEIVER SYSTEM HAVING THE SAME

RELATED APPLICATIONS

This application claims priority to Taiwan Application Serial Number 112121695, filed Jun. 9, 2023, which is herein incorporated by reference.

BACKGROUND

Field of Disclosure

The present disclosure relates to a light-emitting device array and an optical transceiver system having the same.

Description of Related Art

With the progress of today's science and technology, the structure called metasurface in the semiconductor industry is applied to the laser optical system to replace the traditional diffractive optical element (DOE), so that the size of the laser optical element having the metasurface can be miniaturized. In addition, since the geometric structure of the metasurface is smaller than the wavelength of visible light, it can have more diverse light wave phase control abilities as compared with the traditional diffractive optical elements.

Although laser optical elements having the metasurfaces bring the possibility of device size miniaturization and the function of laser beam shaping, the light wave control ability of the metasurrfaces is usually fixed after the process is completed. As a result, the laser optical characteristics of the laser optical elements having the metasurfaces are too uniform, which limits the operational flexibility of their application in the real field.

For the foregoing reason, there is a need to solve the above-mentioned problem by providing a light-emitting device array and an optical transceiver system having the same.

SUMMARY

One aspect of the present disclosure provides a light-emitting device array.

According to some embodiments of the present disclosure, a light-emitting device array includes a first light-emitting device, a second light-emitting device, and a third light-emitting device. The first light-emitting device includes a first light-emitting structure and a first beam shaping structure located on the first light-emitting structure. The first beam shaping structure is configured to convert light emitted by the first light-emitting structure into first structured light. The second light-emitting device includes a second light-emitting structure and a second beam shaping structure located on the second light-emitting structure. The second beam shaping structure is configured to convert light emitted by the second light-emitting structure into second structured light. Speckle patterns and spatial distributions of the first structured light and the second structured light on a projection plane are the same. The third light-emitting device includes a third light-emitting structure and a third beam shaping structure located on the third light-emitting structure. The third beam shaping structure is configured to convert light emitted by the third light-emitting structure into third structured light. A speckle pattern and a spatial distribution of the third structured light and the speckle pattern and the spatial distribution of the first structured light on the projection plane are different.

In some embodiments of the present disclosure, each of the first structured light converted by the first beam shaping structure, the second structured light converted by the second beam shaping structure, and the third structured light converted by the third beam shaping structure has a reference light, and the reference lights are the same as one another.

In some embodiments of the present disclosure, the first beam shaping structure has a first metasurface, the second beam shaping structure has a second metasurface, and the third beam shaping structure has a third metasurface.

In some embodiments of the present disclosure, a geometric pattern of the first metasurface is the same as a geometric pattern of the second metasurface, and the geometric pattern of the first metasurface is different from a geometric pattern of the third metasurface.

In some embodiments of the present disclosure, each of the first metasurface, the second metasurface, and the third metasurface has a plurality of meta-atoms. Each of the meta-atoms is in a shape of a cylindrical column, a square column, a rectangular column, or a combination thereof, and has a square lattice or a hexagonal lattice.

In some embodiments of the present disclosure, each of the first light-emitting structure, the second light-emitting structure, and the third light-emitting structure has a laser diode and a substrate. The substrate is located between the laser diode and the first beam shaping structure, between the laser diode and the second beam shaping structure, or between the laser diode and the third beam shaping structure.

In some embodiments of the present disclosure, the light-emitting device array further includes a submount and an electrode array. The submount carries the first light-emitting structure, the second light-emitting structure, and the third light-emitting structure. The electrode array is located on the submount and has a plurality of N electrodes and a plurality of P electrodes. Each of the first light-emitting structure, the second light-emitting structure, and the third light-emitting structure is electrically connected to one of the N electrodes and one of the P electrodes.

Another aspect of the present disclosure provides an optical transceiver system.

According to some embodiments of the present disclosure, an optical transceiver system includes a light-emitting device array and a receiver array. The light-emitting device array includes a first light-emitting device, a second light-emitting device, and a third light-emitting device. The first light-emitting device includes a first light-emitting structure and a first beam shaping structure located on the first light-emitting structure. The first beam shaping structure is configured to convert light emitted by the first light-emitting structure into first structured light. The second light-emitting device includes a second light-emitting structure and a second beam shaping structure located on the configured to convert light emitted by the second light-emitting structure into second structured light. Speckle patterns and spatial distributions of the first structured light and the second structured light on a projection plane are the same. The third light-emitting device includes a third light-emitting structure and a third beam shaping structure located on the third light-emitting structure. The third beam shaping structure is configured to convert light emitted by the third light-emitting structure into third structured light. A speckle pattern and a spatial distribution of the third structured light and the speckle pattern and the spatial distribution of the first structured light on the projection plane are different. The receiver array is configured to receive the first structured light, the second structured light, and the third structured light.

In some embodiments of the present disclosure, the first beam shaping structure has a first metasurface, the second beam shaping structure has a second metasurface, and the third beam shaping structure has a third metasurface.

In some embodiments of the present disclosure, a geometric pattern of the first metasurface is the same as a geometric pattern of the second metasurface, and the geometric pattern of the first metasurface is different from a geometric pattern of the third metasurface.

In some embodiments of the present disclosure, the optical transceiver system further includes a modulator, a focusing lens, and an image recognition system. The modulator is electrically connected to the light-emitting device array. The focusing lens is disposed on one side of the receiver array. The image recognition system is electrically connected to the receiver array.

In some embodiments of the present disclosure, each of the first structured light converted by the first beam shaping structure, the second structured light converted by the second beam shaping structure, and the third structured light converted by the third beam shaping structure has a reference light, and the reference lights are the same as one another.

In some embodiments of the present disclosure, the light-emitting device array of the optical transceiver system further includes a submount and an electrode array. The submount carries the first light-emitting structure, the second light-emitting structure, and the third light-emitting structure. The electrode array is located on the submount and has a plurality of N electrodes and a plurality of P electrodes. Each of the first light-emitting structure, the second light-emitting structure, and the third light-emitting structure is electrically connected to one of the N electrodes and one of the P electrodes.

Another aspect of the present disclosure provides a light-emitting device array.

According to some embodiments of the present disclosure, a light-emitting device array includes a first light-emitting device, a second light-emitting device, and a third light-emitting device. The first light-emitting device includes a first light-emitting structure and a first beam shaping structure located on the first light-emitting structure. The first beam shaping structure is configured to convert light emitted by the first light-emitting structure into first structured light. The second light-emitting device includes a second light-emitting structure and a second beam shaping structure located on the configured to convert light emitted by the second light-emitting structure into second structured light. The second beam shaping structure has a second metasurface. The third light-emitting device includes a third light-emitting structure and a third beam shaping structure located on the third light-emitting structure. The third beam shaping structure is configured to convert light emitted by the third light-emitting structure into third structured light. A speckle pattern and a spatial distribution of the third structured light and the speckle pattern and the spatial distribution of the first structured light on a projection plane are different.

In some embodiments of the present disclosure, each of the first structured light converted by the first beam shaping structure, the second structured light converted by the second beam shaping structure, and the third structured light converted by the third beam shaping structure has a reference light, and the reference lights are the same as one another.

In some embodiments of the present disclosure, the first beam shaping structure has a first metasurface, and the third beam shaping structure has a third metasurface.

In some embodiments of the present disclosure, a geometric pattern of the first metasurface is the same as a geometric pattern of the second metasurface, and the geometric pattern of the first metasurface is different from a geometric pattern of the third metasurface.

In some embodiments of the present disclosure, each of the first metasurface, the second metasurface, and the third metasurface has a plurality of meta-atoms. Each of the meta-atoms is in a shape of a cylindrical column, a square column, a rectangular column, or a combination thereof, and has a square lattice or a hexagonal lattice.

In some embodiments of the present disclosure, each of the first light-emitting structure, the second light-emitting structure, and the third light-emitting structure has a laser diode and a substrate. The substrate is located between the laser diode and the first beam shaping structure, between the laser diode and the second beam shaping structure, or between the laser diode and the third beam shaping structure.

In some embodiments of the present disclosure, the light-emitting device array further includes a submount and an electrode array. The submount carries the first light-emitting structure, the second light-emitting structure, and the third light-emitting structure. The electrode array is located on the submount and has a plurality of N electrodes and a plurality of P electrodes. Each of the first light-emitting structure, the second light-emitting structure, and the third light-emitting structure is electrically connected to one of the N electrodes and one of the P electrodes.

According to the aforementioned embodiments of the present disclosure, since the light-emitting device array includes the first light-emitting device, the second light-emitting device, and the third light-emitting device, and because the speckle patterns and the spatial distributions of first structured light and the second structured light on the projection plane are the same and the speckle patterns and the spatial distributions of third structured light and the first structured light on the projection plane are different, the first structured light, the second structured light, and the third structured light can realize a variety of different speckle patterns and spatial distributions on the projection plane and allow the light-emitting device array to emit the structured lights with a high degree of freedom. In addition, since the light-emitting device array has a plurality of light-emitting devices, images projected by the light-emitting device array can have better image resolution, and the light-emitting device array can realize the scanning function of the two-dimensional laser beam array.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
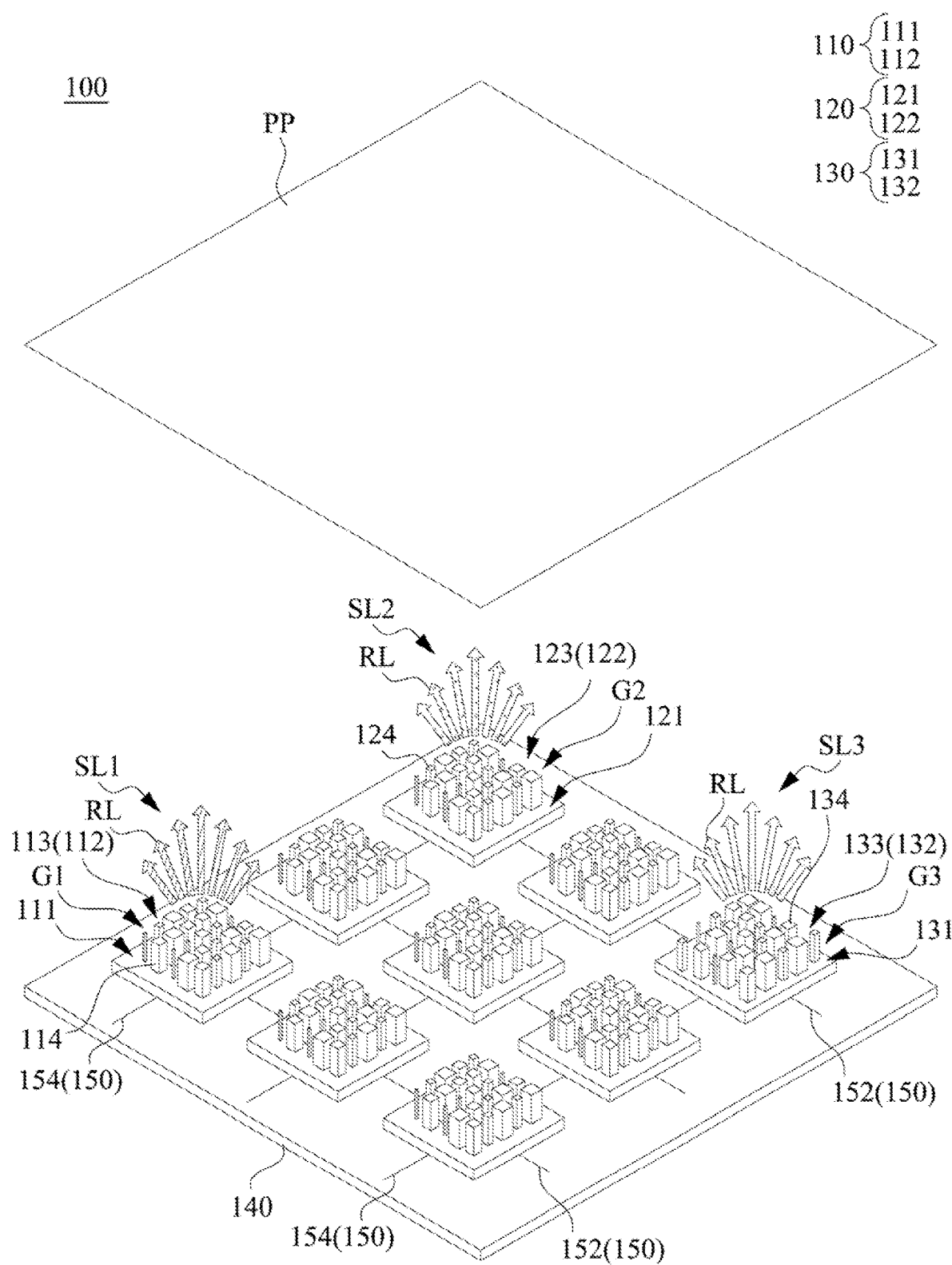
FIG. 1 depicts a perspective view of a light-emitting device array in operation according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Figure 2:
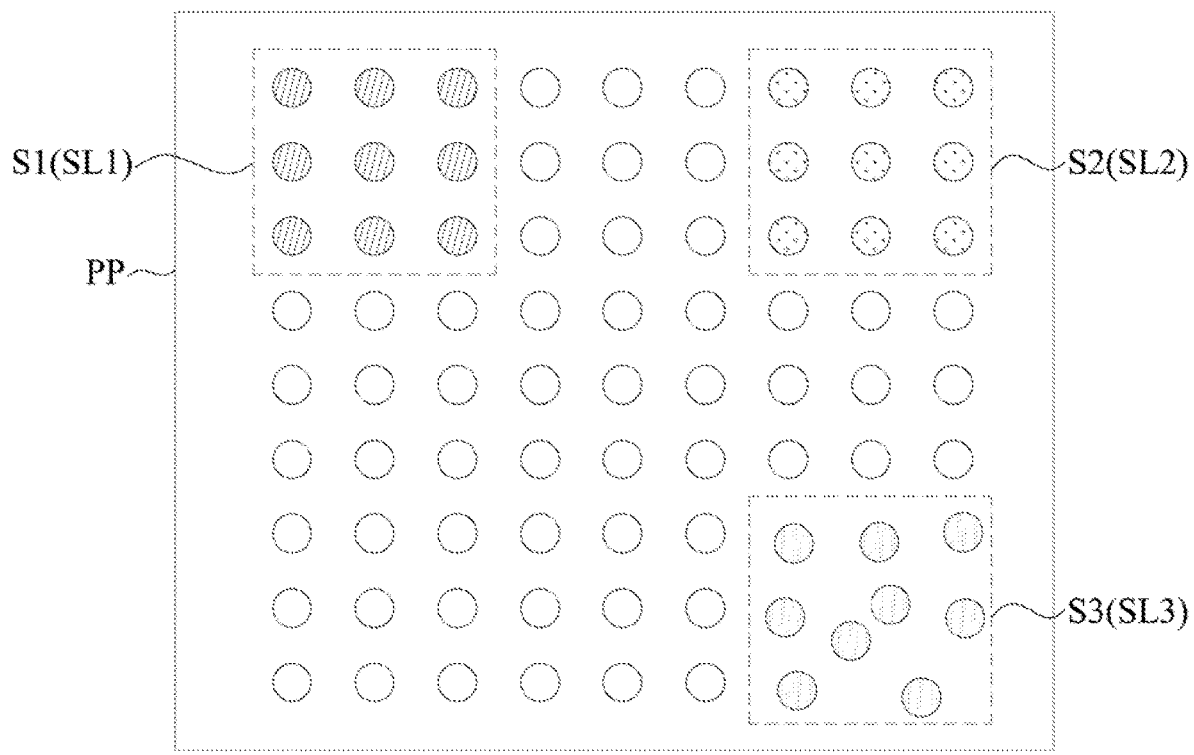
FIG. 2 depicts speckle patterns of the first structured light, the second structured light, and the third structured light in FIG. 1 on a projection plane.

FIG. 1 depicts a schematic view of a light-emitting device array 100 in operation according to one embodiment of the present disclosure. FIG. 2 depicts speckle patterns S1 to S3 of first structured light SL1, second structured light SL2, and third structured light SL3 in FIG. 1 on a projection plane PP. A description is provided with reference to FIG. 1 and FIG. 2. The light-emitting device array 100 includes a first light-emitting device 110, a second light-emitting device 120, and a third light-emitting device 130. The first light-emitting device 110 includes a first light-emitting structure 111 and a first beam shaping structure 112 located on the first light-emitting structure 111. The first beam shaping structure 112 is configured to convert light emitted by the first light-emitting structure 111 into the first structured light SL1. The second light-emitting device 120 includes a second light-emitting structure 121 and a second beam shaping structure 122 located on the second light-emitting structure 121. The second beam shaping structure 122 is configured to convert light emitted by the second light-emitting structure 121 into the second structured light SL2. On the projection plane PP, spatial distributions of the first structured light SL1 and the second structured light SL2 are the same, and the speckle pattern S1 of first structured light SL1 and the speckle pattern S2 of the second structured light SL2 are the same. The third light-emitting device 130 includes a third light-emitting structure 131 and a third beam shaping structure 132 located on the third light-emitting structure 131. The third beam shaping structure 132 is configured to convert light emitted by the third light-emitting structure 131 into the third structured light SL3. On the projection plane PP, the spatial distribution of the first structured light SL1 and a spatial distribution of the third structured light SL3 are different, and the speckle pattern S1 of first structured light SL1 and the speckle pattern S3 of the third structured light SL3 are also different.

In some embodiments, the projection plane may be a face or a hand of a person. For example, the light-emitting device array 100 can be applied to a facial recognition system, facial expression recognition of a mobile phone, 3D sensing of augmented reality (AR) glasses, and pedestrian and hand recognition in a somatosensory game. In some other embodiments, the projection plane PP may be some other plane, and the present disclosure is not limited in this regard.

In greater detail, since the light-emitting device array 100 includes the first light-emitting device 110, the second light-emitting device 120, and the third light-emitting device 130, and because on the projection plane PP the speckle pattern S1 of first structured light SL1 and the speckle pattern S2 of the second structured light SL2 are the same and they are different from the speckle pattern S3 of the third structured light SL3, the first structured light SL1, the second structured light SL2, and the third structured light SL3 can realize a variety of different speckle patterns and spatial distributions on the projection plane PP and allow the light-emitting device array 100 to emit structured lights with a high degree of freedom. In addition, since the light-emitting device array 100 has a plurality of light-emitting devices (such as the first light-emitting device 110, the second light-emitting device 120, and the third light-emitting device 130), images projected by the light-emitting device array 100 can have better image resolution, and the light-emitting device array 100 can be applied to the scanning function of the two-dimensional laser beam array.

Additionally, each of the first structured light SL1 converted by the first beam shaping structure 112, the second structured light SL2 converted by the second beam shaping structure 122, and the third structured light SL3 converted by the third beam shaping structure 132 has a reference light RL, and the refence lights RL are the same as one another. Such a configuration can allow the light-emitting device array 100 to have the functions of calibration and positioning in 3D sensing.

In some embodiments, the first beam shaping structure 112 has a first metasurface 113, the second beam shaping structure 122 has a second metasurface 123, and the third beam shaping structure 132 has a third metasurface 133. Since the first light-emitting structure 111, the second light-emitting structure 121, and the third light-emitting structure 131 may be semiconductor laser devices, and the process of the metasurfaces and the process of the semiconductor laser devices can be integrated, the process of the light-emitting device array 100 can skip the optical device manufacturer and the semiconductor packaging manufacturer for configuring the diffractive optical elements (DOE) and realize monolithic integration. As a result, a size of the light-emitting device array 100 can be further reduced.

Figure 4:
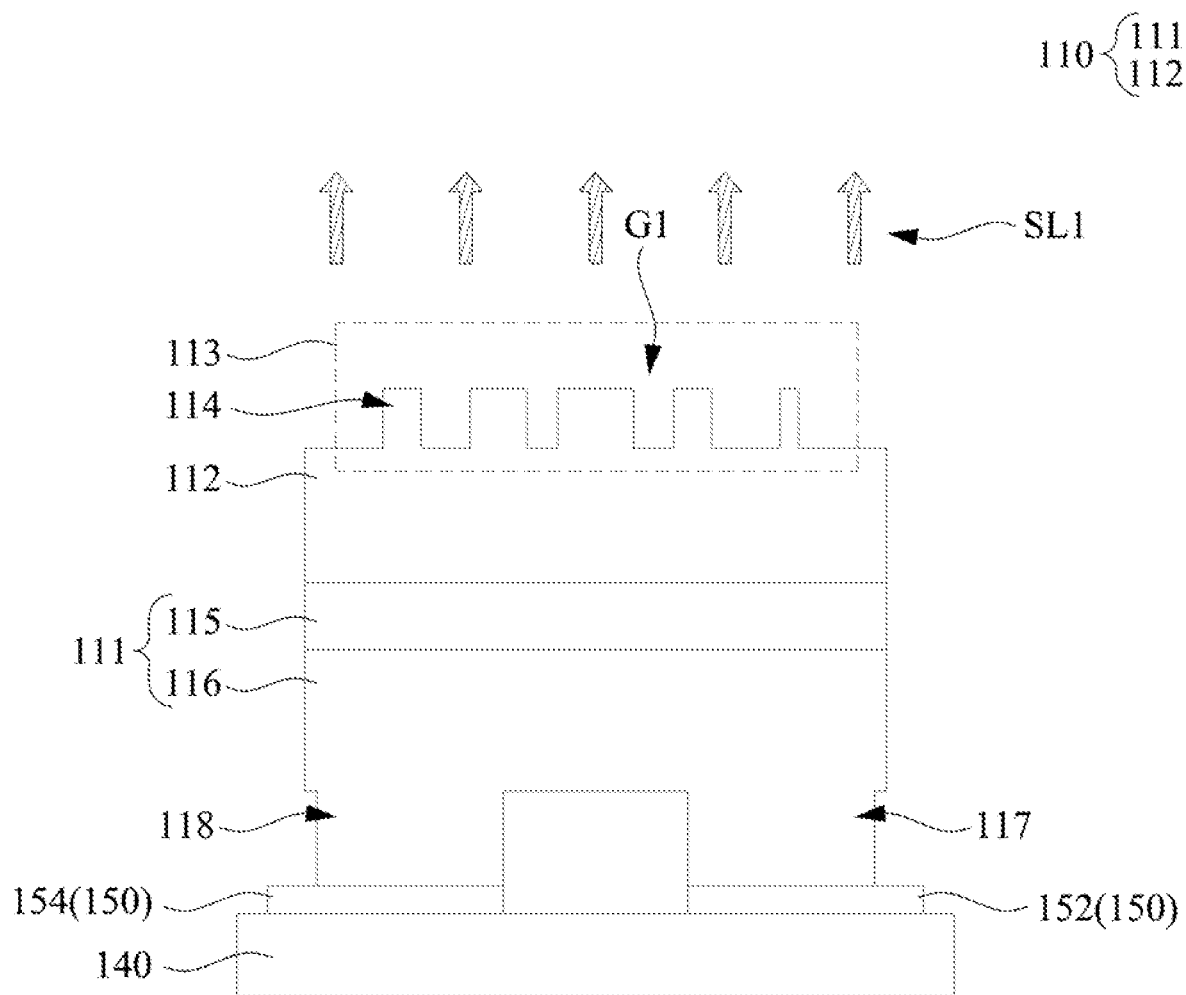
FIG. 4 depicts a cross-sectional view of the first light-emitting device in FIG. 1 in operation on a submount and an electrode array.
Figure 5:
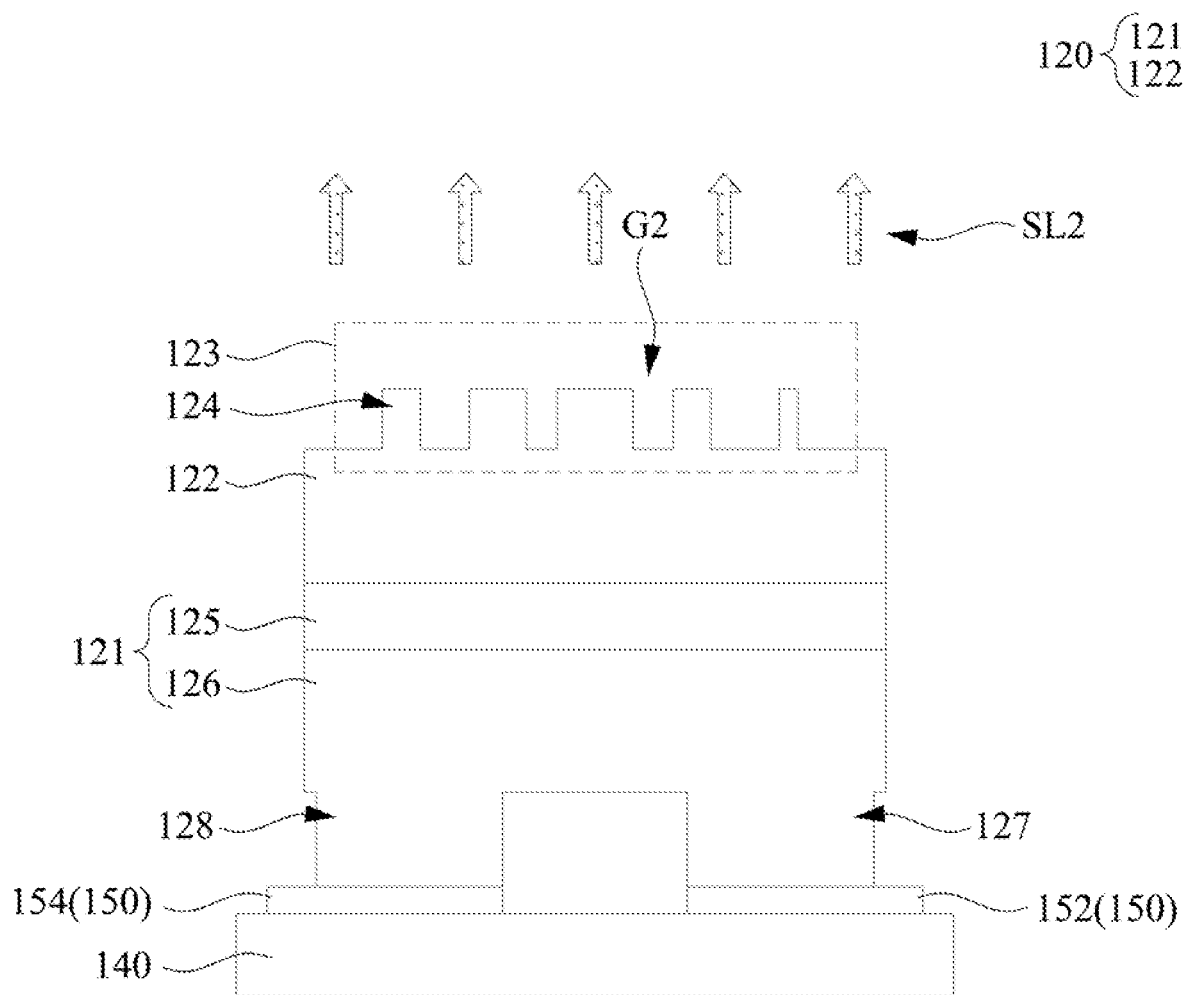
FIG. 5 depicts a cross-sectional view of the second light-emitting device in FIG. 1 in operation on a submount and an electrode array.
Figure 6:
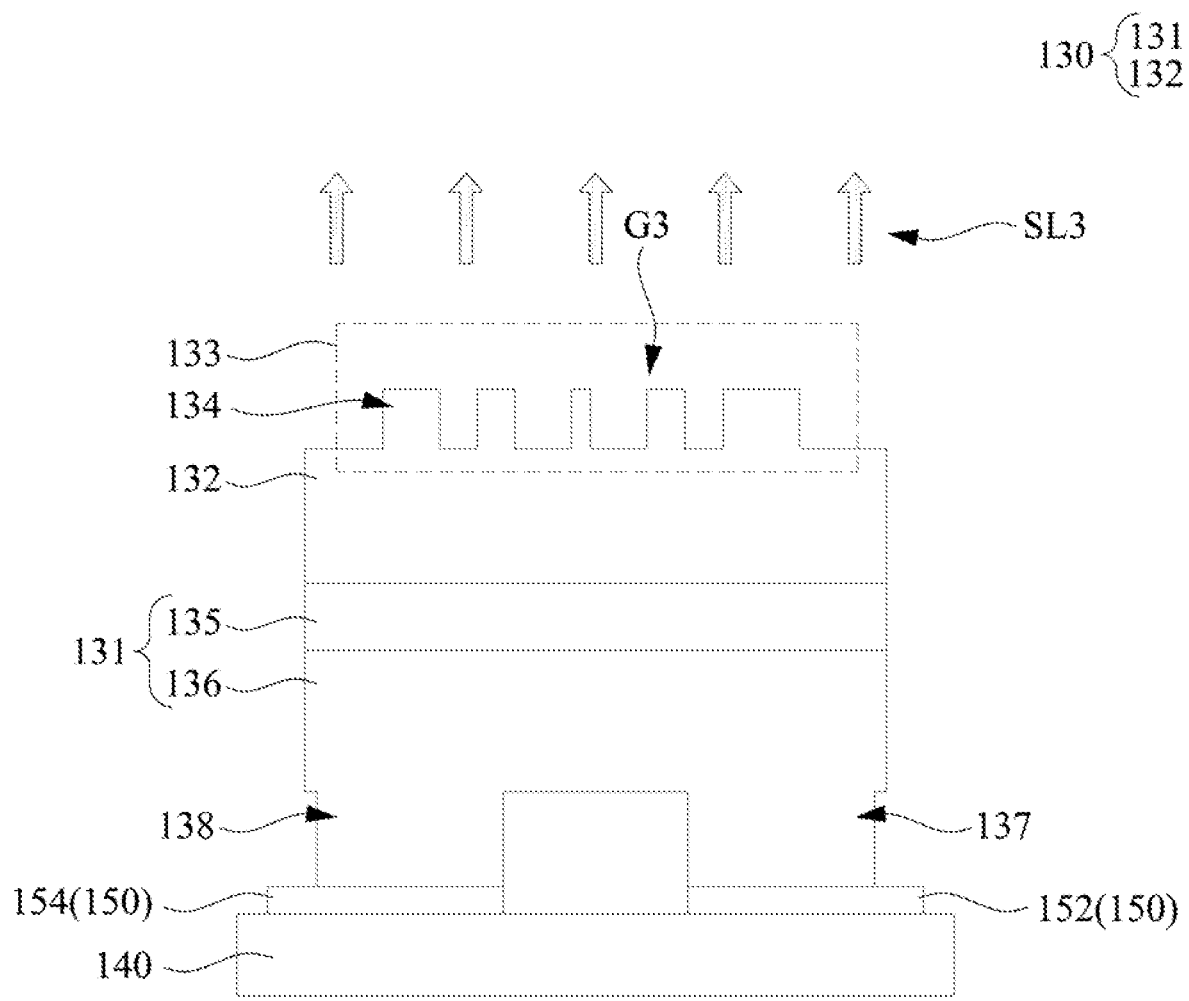
FIG. 6 depicts a cross-sectional view of the third light-emitting device in FIG. 1 in operation on a submount and an electrode array.

In addition to that, a geometric pattern G1 of the first metasurface 113 is the same as a geometric pattern G2 of the second metasurface 123 (as shown in FIG. 4 and FIG. 5), and the geometric pattern G1 of the first metasurface 113 is different from a geometric pattern G3 of the third metasurface 133 (as shown in FIG. 4 and FIG. 6). Such a configuration allows the speckle pattern S1 of first structured light SL1 to be the same as the speckle pattern S2 of the second structured light SL2 and to be different from the speckle pattern S3 of the third structured light SL3, so that the light-emitting device array 100 can be applied to the time-multiplexing technology with high resolution and high precision. In some embodiments, each of the speckle pattern S1, the speckle pattern S2, and the speckle pattern S3 may include a dot array, a random speckle arrangement, or a mesh pattern distribution. In the present embodiment, the speckle pattern S1 and the speckle pattern S2 are dot arrays, and the speckle pattern S3 is a random speckle arrangement.

In addition, the light-emitting device array 100 may further include a submount 140 and an electrode array 150. The submount 140 carries the first light-emitting structure 111, the second light-emitting structure 121, and the third light-emitting structure 131. The electrode array 150 is located on the submount 140. The electrode array 150 has a plurality of N electrodes 152 and a plurality of P electrodes 154. Each of the first light-emitting structure 111 of the first light-emitting device 110, the second light-emitting structure 121 of the second light-emitting device 120, and the third light-emitting structure 131 of the third light-emitting device 130 is electrically connected to one of the N electrodes 152 and one of the P electrodes 154. Such a configuration allows each of the first light-emitting device 110, the second light-emitting device 120, and the third light-emitting device 130 of the light-emitting device array 100 to operate independently (for example, independently control the lighting up and lighting off of each of the light-emitting devices), so that the light-emitting device array 100 can emit the structured lights with a high degree of freedom.

Figure 3A:
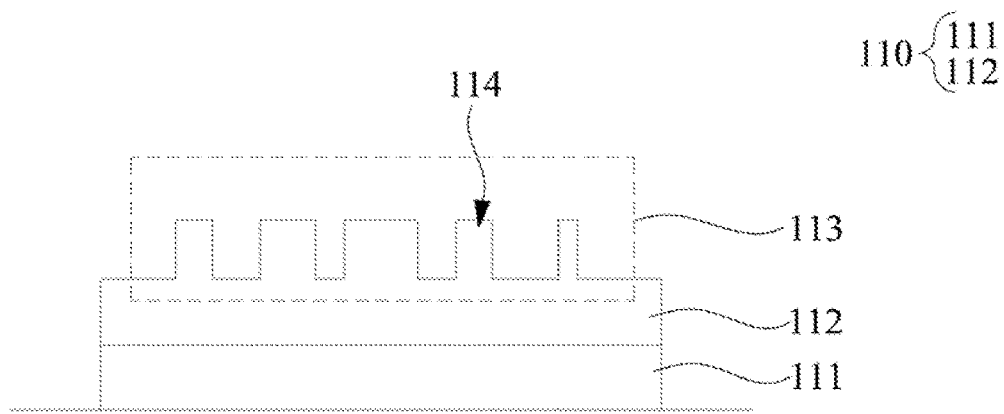
FIG. 3A depicts a side view of the first light-emitting device in FIG. 1 on an electrode array.
Figure 3B:
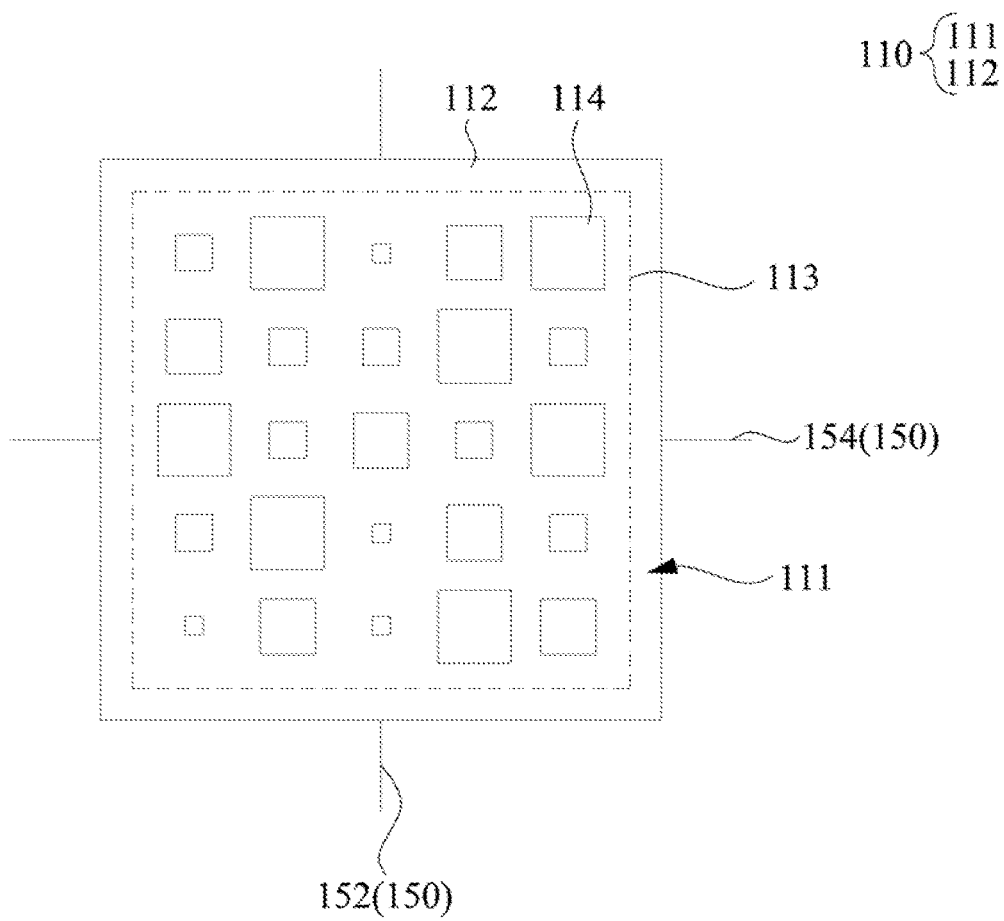
FIG. 3B depicts a top view of the first light-emitting device in FIG. 1 on an electrode array.

FIG. 3A depicts a side view of the first light-emitting device 110 in FIG. 1 on the electrode array 150. FIG. 3B depicts a top view of the first light-emitting device 110 in FIG. 1 on the electrode array 150. A description is provided with reference to FIG. 3A and FIG. 3B. The first light-emitting device 110 includes the first light-emitting structure 111 and the first beam shaping structure 112 located on the first light-emitting structure 111. The first beam shaping structure 112 has the first metasurface 113. The first metasurface 113 has a plurality of meta-atoms 114. In some embodiments, each of the meta-atoms 114 may be in a shape of a cylindrical column, a square column, a rectangular column, or a combination thereof, and may have a square lattice or a hexagonal lattice. Additionally, top surface areas of these meta-atoms 114 may be different, so that the first beam shaping structure 112 can determine the spatial distribution and optical characteristics of the first structured light SL1. In some embodiments, one type of the spatial distribution of the first structured light SL1 can be designed by using computer generated holography (CGH), and the geometric pattern G1 of the first metasurface 113 and the arrangement method of the meta-atoms 114 can be constructed based on the ideal far-field pattern of the first structured light SL1. Since the configurations of the second light-emitting device 120 and the third light-emitting device 130 are similar to FIG. 3, a description in this regard is not repeated.

FIG. 4 depicts a cross-sectional view of the first light-emitting device 110 in FIG. 1 in operation on the submount 140 and the electrode array 150. A description is provided with reference to FIG. 4 and FIG. 1. The first light-emitting device 110 includes the first light-emitting structure 111 and the first beam shaping structure 112 located on the first light-emitting structure 111. The submount 140 carries the first light-emitting structure 111. The electrode array 150 is located on the submount 140. According to the present embodiment, the first light-emitting structure 111 may have a substrate 115 and a laser diode 116, and the substrate 115 is located between the laser diode 116 and the first beam shaping structure 112. This configuration is a flip chip structure, which can occupy a smaller volume as compared with a structure using the wire bonding technology. It is thus beneficial for the miniaturization of the light-emitting device array 100. In addition to that, an N electrode 117 and a P electrode 118 of the laser diode 116 may be electrically connected to the N electrode 152 and the P electrode 154 of the electrode array 150, respectively. As a result, the laser diode 116 can be driven by the electrode array 150 to emit a laser beam towards the first beam shaping structure 112, and the laser beam is converted into the first structured light SL1 having the reference light RL by the first beam shaping structure 112. In some embodiments, the laser diode 116 may include a vertical cavity surface emitting laser (VCSEL) or a photonic crystal surface emitting laser (PCSEL), but the present disclosure is not limited in this regard.

FIG. 5 depicts a cross-sectional view of the second light-emitting device 120 in FIG. 1 in operation on the submount 140 and the electrode array 150. A description is provided with reference to FIG. 5 and FIG. 1. The second light-emitting device 120 includes the second light-emitting structure 121 and the second beam shaping structure 122 located on the second light-emitting structure 121. In the present embodiment, the second beam shaping structure 122 is the same as the first beam shaping structure 112 in FIG. 4. The submount 140 carries the second light-emitting structure 121. The electrode array 150 is located on the submount 140. According to the present embodiment, the second light-emitting structure 121 may have a substrate 125 and a laser diode 126, and the substrate 125 is located between the laser diode 126 and the second beam shaping structure 122. This configuration is a flip chip structure, which can occupy a smaller volume as compared with a structure using the wire bonding technology. It is thus beneficial for the miniaturization of the light-emitting device array 100. In addition, an N electrode 127 and a P electrode 128 of the laser diode 126 may be electrically connected to the N electrode 152 and the P electrode 154 of the electrode array 150, respectively. In some embodiments, the laser diode 126 may include a vertical cavity surface emitting laser (VCSEL) or a photonic crystal surface emitting laser (PCSEL), but the present disclosure is not limited in this regard.

Additionally, the second beam shaping structure 122 has the second metasurface 123, and the second metasurface 123 may have a plurality of meta-atoms 124. In some embodiments, each of the meta-atoms 124 may be in a shape of a cylindrical column, a square column, a rectangular column, or a combination thereof, and may have a square lattice or a hexagonal lattice. Top surface areas of these meta-atoms 124 may be different, so that the second beam shaping structure 122 can determine the spatial distribution and optical characteristics of the second structured light SL2. In some embodiments, one type of the spatial distribution of the second structured light SL2 can be designed by using computer generated holography (CGH), and the geometric pattern G2 of the second metasurface 123 and the arrangement method of the meta-atoms 124 can be constructed based on the ideal far-field pattern of the second structured light SL2. As a result, the laser diode 126 can be driven by the electrode array 150 to emit a laser beam towards the second beam shaping structure 122, and the laser beam is converted into the second structured light SL2 having the reference light RL by the second beam shaping structure 122. In the present embodiment, the arrangement method of the meta-atoms 124 may be the same as that of the meta-atoms 114 in FIG. 4 and the geometric pattern G2 of the second metasurface 123 is the same as the geometric pattern G1 of the first metasurface 113, so that the spatial distributions of the first structured light SL1 and the second structured light SL2 may be the same.

FIG. 6 depicts a cross-sectional view of the third light-emitting device 130 in FIG. 1 in operation on the submount 140 and the electrode array 150. A description is provided with reference to FIG. 6 and FIG. 1. The third light-emitting device 130 includes the third light-emitting structure 131 and the third beam shaping structure 132 located on the third light-emitting structure 131. In the present embodiment, the third beam shaping structure 132 is different from the first beam shaping structure 112 in FIG. 4, and is also different from the second beam shaping structure 122 in FIG. 5. The submount 140 carries the third light-emitting structure 131. The electrode array 150 is located on the submount 140. According to the present embodiment, the third light-emitting structure 131 may have a substrate 135 and a laser diode 136, and the substrate 135 is located between the laser diode 136 and the third beam shaping structure 132. This configuration is a flip chip structure, which can occupy a smaller volume as compared with a structure using the wire bonding technology. It is thus beneficial for the miniaturization of the light-emitting device array 100. In addition to that, an N electrode 137 and a P electrode 138 of the laser diode 136 may be electrically connected to one of the N electrodes 152 and one of the P electrodes 154 of the electrode array 150, respectively. In some embodiments, the laser diode 136 may include a vertical cavity surface emitting laser (VCSEL) or a photonic crystal surface emitting laser (PCSEL), but the present disclosure is not limited in this regard.

In addition, the third beam shaping structure 132 has the third metasurface 133, and the third metasurface 133 has a plurality of meta-atoms 134. In some embodiments, each of the meta-atoms 134 may be in a shape of a cylindrical column, a square column, a rectangular column, or a combination thereof, and may have a square lattice or a hexagonal lattice. Top surface areas of these meta-atoms 134 may be different, so that the third beam shaping structure 132 can determine the spatial distribution and optical characteristics of the third structured light SL3. In some embodiments, one type of the spatial distribution of the third structured light SL3 can be designed by using computer generated holography (CGH), and the geometric pattern G3 of the third metasurface 133 and the arrangement method of the meta-atoms 134 can be constructed based on the ideal far-field pattern of the third structured light SL3. As a result, the laser diode 136 can be driven by the electrode array 150 to emit a laser beam towards the third beam shaping structure 132, and the laser beam is converted into the third structured light SL3 having the reference light RL by the third beam shaping structure 132. In the present embodiment, the arrangement method of the meta-atoms 134 is different from that of the meta-atoms 114 in FIG. 4 and the geometric pattern G3 of the third metasurface 133 is different from the geometric pattern G1 of the first metasurface 113, so that the spatial distributions of the third structured light SL3 and the first structured light SL1 can be different.

It should be understood that the connection relationships, materials, and functions of the devices that have been described is not repeated, and that must be explained first. In the following description, an optical transceiver system having a light-emitting device array is provided.

Figure 7:
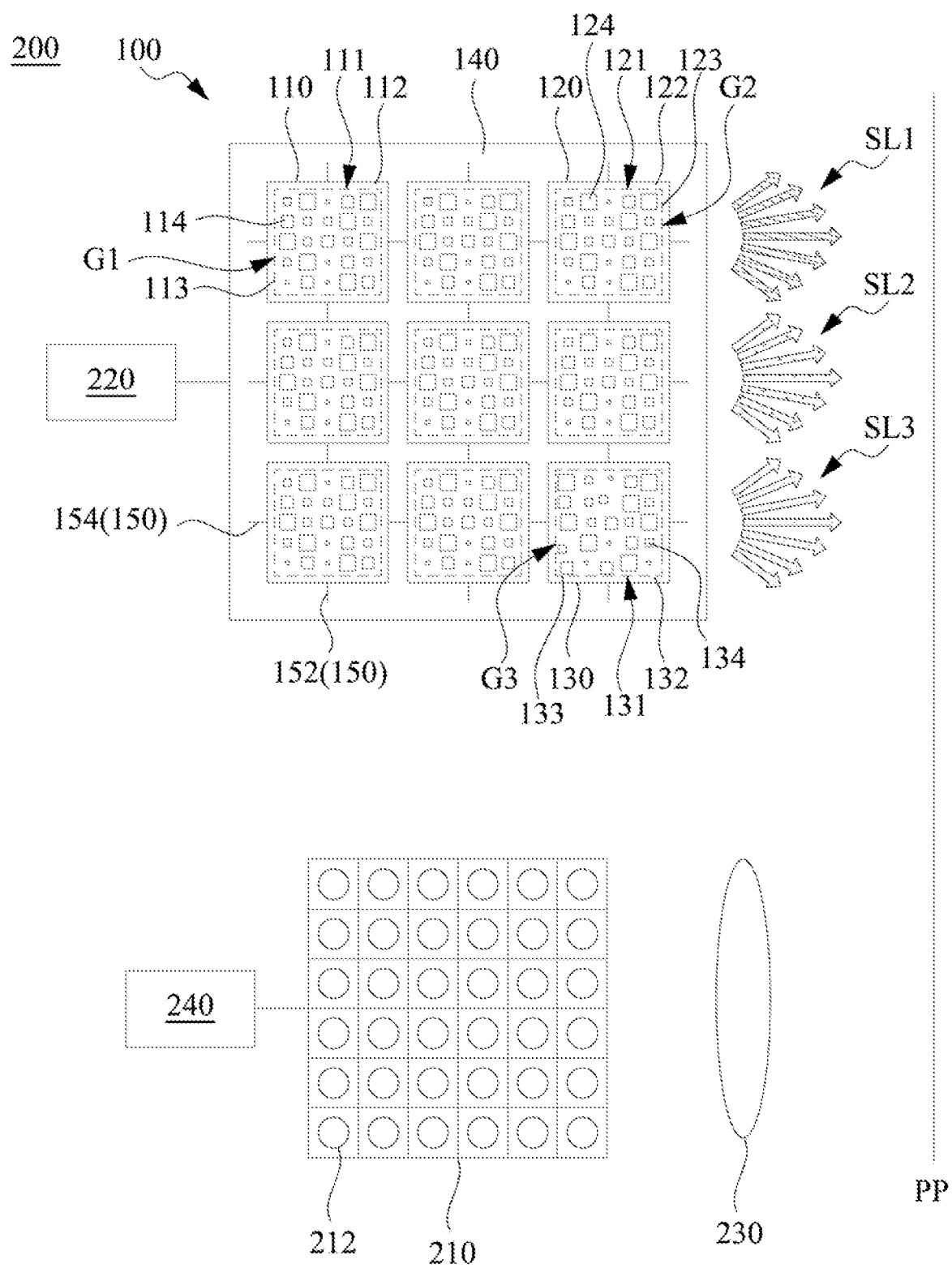
FIG. 7 depicts a schematic diagram of an optical transceiver system in operation according to one embodiment of the present disclosure.
Figure 8:
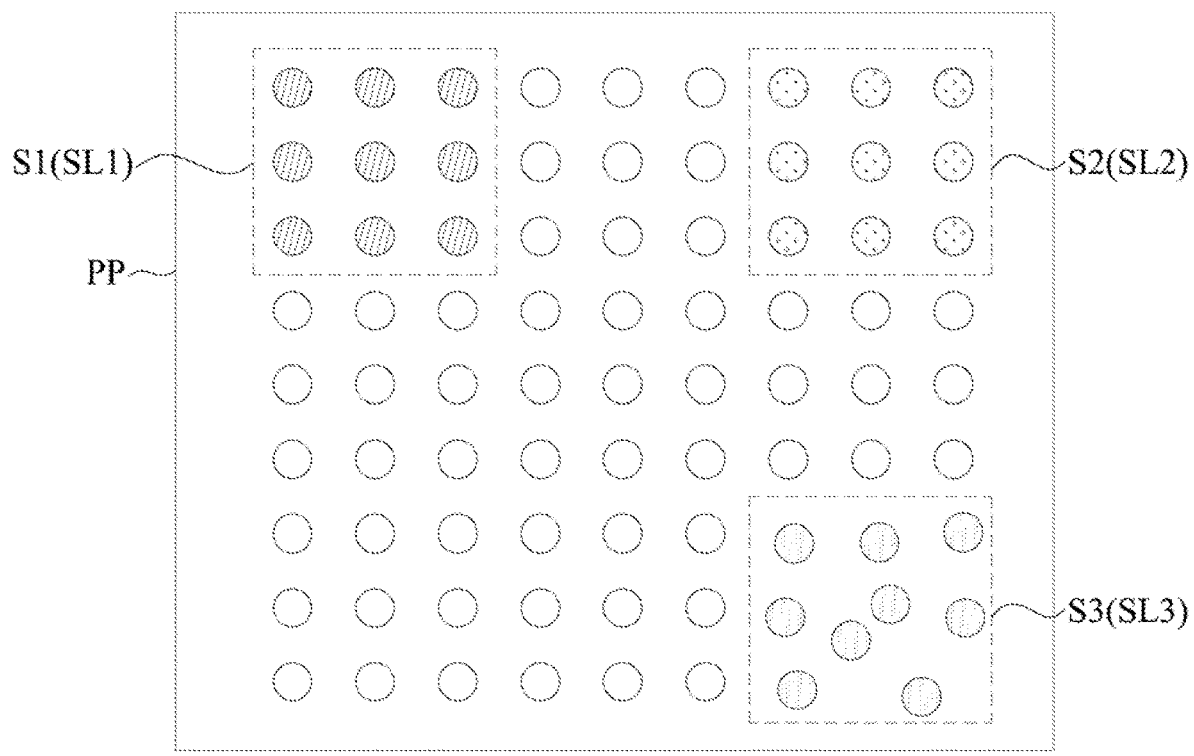
FIG. 8 depicts speckle patterns of the first structured light, the second structured light, and the third structured light in FIG. 7 on a projection plane.

FIG. 7 depicts a schematic diagram of an optical transceiver system 200 in operation according to one embodiment of the present disclosure. FIG. 8 depicts the speckle patterns S1 to S3 of the first structured light SL1, the second structured light SL2, and the third structured light SL3 in FIG. 7 on the projection plane PP. The optical transceiver system 200 includes a receiver array 210 and the previously mentioned light-emitting device array 100. The light-emitting device array 100 includes the first light-emitting device 110, the second light-emitting device 120, and the third light-emitting device 130. On the projection plane PP, the spatial distributions of the first structured light SL1 and the second structured light SL2 are the same, and the speckle pattern S1 of first structured light SL1 and the speckle pattern S2 of the second structured light SL2 are the same. Additionally, on the projection plane PP, the spatial distributions of the first structured light SL1 and the third structured light SL3 are different, and the speckle pattern S1 of first structured light SL1 and the speckle pattern S3 of the third structured light SL3 are also different. The receiver array 210 has a plurality of receivers 212, and can receive the first structured light SL1, the second structured light SL2, and the third structured light SL3 reflected by the projection plane PP. In greater detail, the light-emitting device array 100 can emit the structured lights with a high degree of freedom (including the first structured light SL1, the second structured light SL2 and the third structured light SL3) to the receiver array 210. Therefore, images received by the receiver array 210 can have better image resolution, and the optical transceiver system 200 can realize the scanning function of the two-dimensional laser beam array (can freely control the turning on and turning off of each light-emitting device of the light-emitting device array 100 (such as the first light-emitting device 110, the second light-emitting device 120, and the third light-emitting device 130)).

In some embodiments, the optical transceiver system 200 may further include a modulator 220, a focusing lens 230, and an image recognition system 240. The modulator 220 is electrically connected to the light-emitting device array 100, so that the modulator 220 can control the first light-emitting device 110, the second light-emitting device 120, and the third light-emitting device 130 through the electrode array 150. The focusing lens 230 is disposed on one side of the receiver array 210, for example, located between the projection plane PP and the receiver array 210. The focusing lens 230 is configured so that the first structured light SL1, the second structured light SL2, and the third structured light SL3 can be focused on receiver array 210. The image recognition system 240 is electrically connected to the receiver array 210, so that the optical transceiver system 200 can have the function of feature recognition, and can be applied to the image reconstruction technology. In addition to that, the optical transceiver system 200 having the light-emitting device array 100 and the receiver array 210 can be applied to a facial recognition system, facial expression recognition of a mobile phone, 3D sensing of augmented reality (AR) glasses, and pedestrian and hand recognition in a somatosensory game.

The foregoing outlines features of several embodiments of the present disclosure so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure covers modifications and variations of this disclosure provided they fall within the scope of the following claims and their equivalents.

What is claimed is:

1. A light-emitting device array comprising:
    a first light-emitting device comprising a first light-emitting structure and a first beam shaping structure located on the first light-emitting structure, wherein the first beam shaping structure is configured to convert light emitted by the first light-emitting structure into a first structured light, and the first beam shaping structure comprises a first metasurface having a first top view shape;
    a second light-emitting device comprising a second light-emitting structure and a second beam shaping structure located on the second light-emitting structure, wherein the second beam shaping structure is configured to convert light emitted by the second light-emitting structure into a second structured light, and speckle patterns and spatial distributions of the first structured light and the second structured light on a projection plane are the same, and the second beam shaping structure comprises a second metasurface having a second top view shape that is the same as the first top view shape;
    a third light-emitting device comprising a third light-emitting structure and a third beam shaping structure located on the third light-emitting structure, wherein the third beam shaping structure is configured to convert light emitted by the third light-emitting structure into a third structured light, and a speckle pattern and a spatial distribution of the third structured light and the speckle pattern and the spatial distribution of the first structured light on the projection plane are different, and the third beam shaping structure comprises a third metasurface having a third top view shape that is different from the first top view shape; and
    a submount carrying the first light-emitting structure, the second light-emitting structure, and the third light-emitting structure, wherein the first beam shaping structure and the third beam shaping structure are respectively located on two corners of the submount passed by a diagonal line, and the first beam shaping structure and the second beam shaping structure are respectively located on two adjacent corners of the submount.

2. The light-emitting device array of claim 1, wherein each of the first structured light converted by the first beam shaping structure, the second structured light converted by the second beam shaping structure, and the third structured light converted by the third beam shaping structure has a reference light, and the reference lights are the same as one another.

3. The light-emitting device array of claim 1, wherein a geometric pattern of the first metasurface is the same as a geometric pattern of the second metasurface, and the geometric pattern of the first metasurface is different from a geometric pattern of the third metasurface.

4. The light-emitting device array of claim 1, wherein each of the first metasurface, the second metasurface, and the third metasurface has a plurality of meta-atoms, each of the meta-atoms is in a shape of a cylindrical column, a square column, a rectangular column, or a combination thereof, and has a square lattice or a hexagonal lattice.

5. The light-emitting device array of claim 1, wherein each of the first light-emitting structure, the second light-emitting structure, and the third light-emitting structure has a laser diode and a substrate, and the substrate is located between the laser diode and the first beam shaping structure, between the laser diode and the second beam shaping structure, or between the laser diode and the third beam shaping structure.

6. The light-emitting device array of claim 1, further comprising:
    an electrode array located on the submount and having a plurality of N electrodes and a plurality of P electrodes, wherein each of the first light-emitting structure, the second light-emitting structure, and the third light-emitting structure is electrically connected to one of the N electrodes and one of the P electrodes.

7. An optical transceiver system comprising:
    a light-emitting device array comprising:
        a first light-emitting device comprising a first light-emitting structure and a first beam shaping structure located on the first light-emitting structure, wherein the first beam shaping structure is configured to convert light emitted by the first light-emitting structure into a first structured light, and the first beam shaping structure comprises a first metasurface having a first top view shape;
        a second light-emitting device comprising a second light-emitting structure and a second beam shaping structure located on the second light-emitting structure, wherein the second beam shaping structure is configured to convert light emitted by the second light-emitting structure into a second structured light, and speckle patterns and spatial distributions of the first structured light and the second structured light on a projection plane are the same, and the second beam shaping structure comprises a second metasurface having a second top view shape that is the same as the first top view shape;
        a third light-emitting device comprising a third light-emitting structure and a third beam shaping structure located on the third light-emitting structure, wherein the third beam shaping structure is configured to convert light emitted by the third light-emitting structure into a third structured light, and a speckle pattern and a spatial distribution of the third structured light and the speckle pattern and the spatial distribution of the first structured light on the projection plane are different, and the third beam shaping structure comprises a third metasurface having a third top view shape that is different from the first top view shape; and a submount carrying the first light-emitting structure, the second light-emitting structure, and the third light-emitting structure, wherein the first beam shaping structure and the third beam shaping structure are respectively located on two corners of the submount passed by a diagonal line, and the first beam shaping structure and the second beam shaping structure are respectively located on two adjacent corners of the submount; and a receiver array configured to receive the first structured light, the second structured light, and the third structured light.

8. The optical transceiver system of claim 7, wherein a geometric pattern of the first metasurface is the same as a geometric pattern of the second metasurface, and the geometric pattern of the first metasurface is different from a geometric pattern of the third metasurface.

9. The optical transceiver system of claim 7, further comprising:
a modulator electrically connected to the light-emitting device array;
a focusing lens disposed on one side of the receiver array; and
an image recognition system electrically connected to the receiver array.

10. The optical transceiver system of claim 7, wherein each of the first structured light converted by the first beam shaping structure, the second structured light converted by the second beam shaping structure, and the third structured light converted by the third beam shaping structure has a reference light, and the reference lights are the same as one another.

11. The optical transceiver system of claim 7, wherein the light-emitting device array further comprises:
an electrode array located on the submount and having a plurality of N electrodes and a plurality of P electrodes, wherein each of the first light-emitting structure, the second light-emitting structure, and the third light-emitting structure is electrically connected to one of the N electrodes and one of the P electrodes.

12. A light-emitting device array, comprising:
a first light-emitting device comprising a first light-emitting structure and a first beam shaping structure located on the first light-emitting structure, wherein the first beam shaping structure is configured to convert light emitted by the first light-emitting structure into a first structured light, and the first beam shaping structure comprises a first metasurface having a first top view shape;
a second light-emitting device comprising a second light-emitting structure and a second beam shaping structure located on the second light-emitting structure, wherein the second beam shaping structure is configured to convert light emitted by the second light-emitting structure into a second structured light, and the second beam shaping structure has a second metasurface having a second top view shape that is the same as the first top view shape;
a third light-emitting device comprising a third light-emitting structure and a third beam shaping structure located on the third light-emitting structure, wherein the third beam shaping structure is configured to convert light emitted by the third light-emitting structure into a third structured light, and a speckle pattern and a spatial distribution of the third structured light and the speckle pattern and the spatial distribution of the first structured light on a projection plane are different, and the third beam shaping structure comprises a third metasurface having a third top view shape that is different from the first top view shape; and
a submount carrying the first light-emitting structure, the second light-emitting structure, and the third light-emitting structure, wherein the first beam shaping structure and the third beam shaping structure are respectively located on two corners of the submount passed by a diagonal line, and the first beam shaping structure and the second beam shaping structure are respectively located on two adjacent corners of the submount.

13. The light-emitting device array of claim 12, wherein each of the first structured light converted by the first beam shaping structure, the second structured light converted by the second beam shaping structure, and the third structured light converted by the third beam shaping structure has a reference light, and the reference lights are the same as one another.

14. The light-emitting device array of claim 12, wherein a geometric pattern of the first metasurface is the same as a geometric pattern of the second metasurface, and the geometric pattern of the first metasurface is different from a geometric pattern of the third metasurface.

15. The light-emitting device array of claim 12, wherein each of the first metasurface, the second metasurface, and the third metasurface has a plurality of meta-atoms, each of the meta-atoms is in a shape of a cylindrical column, a square column, a rectangular column, or a combination thereof, and has a square lattice or a hexagonal lattice.

16. The light-emitting device array of claim 12, wherein each of the first light-emitting structure, the second light-emitting structure, and the third light-emitting structure has a laser diode and a substrate, and the substrate is located between the laser diode and the first beam shaping structure, between the laser diode and the second beam shaping structure, or between the laser diode and the third beam shaping structure.

17. The light-emitting device array of claim 12, further comprising:
an electrode array located on the submount and having a plurality of N electrodes and a plurality of P electrodes, wherein each of the first light-emitting structure, the second light-emitting structure, and the third light-emitting structure is electrically connected to one of the N electrodes and one of the P electrodes.

* * * * *